United States Patent [19]

Hirao

[11] Patent Number: 4,803,174
[45] Date of Patent: Feb. 7, 1989

[54] BIPOLAR TRANSISTOR INTEGRATED CIRCUIT AND METHOD OF MANUFACTURING THE SAME

[75] Inventor: Tadashi Hirao, Itami, Japan

[73] Assignee: Mitsubishi Denki Kabushiki Kaisha, Tokyo, Japan

[21] Appl. No.: 121,912

[22] Filed: Nov. 17, 1987

Related U.S. Application Data

[63] Continuation of Ser. No. 801,789, Nov. 26, 1985, abandoned.

[30] Foreign Application Priority Data

Dec. 20, 1984 [JP] Japan ................................ 59-271239

[51] Int. Cl.$^4$ ........................................ H01L 21/225
[52] U.S. Cl. ..................................... 437/31; 437/27; 437/160; 437/162; 437/61
[58] Field of Search .................. 437/31, 27, 61, 160, 437/162; 357/34

[56] References Cited

U.S. PATENT DOCUMENTS

| | | |
|---|---|---|
| 3,742,319 | 6/1973 | Bryan et al. |
| 4,188,707 | 2/1980 | Asano et al. ...................... 357/59 |
| 4,441,932 | 4/1984 | Akasaka et al. ..................... 357/34 |
| 4,445,268 | 5/1984 | Hirao ................................ 357/34 |
| 4,481,706 | 11/1984 | Roche .............................. 357/59 |
| 4,495,512 | 1/1985 | Isaac et al. ......................... 357/34 |
| 4,521,952 | 6/1985 | Riseman ........................... 357/34 |
| 4,550,490 | 11/1985 | Blossfeld .......................... 437/31 |
| 4,640,721 | 2/1987 | Uehara et al. ..................... 437/31 |
| 4,662,062 | 5/1987 | Toyooka et al. ................... 437/31 |
| 4,705,599 | 11/1987 | Suda et al. ........................ 437/53 |

FOREIGN PATENT DOCUMENTS

| | | |
|---|---|---|
| 0046257 | 2/1982 | European Pat. Off. |
| 0051534 | 5/1982 | European Pat. Off. ............. 437/31 |
| 0083816 | 12/1982 | European Pat. Off. |
| 159179 | 10/1985 | European Pat. Off. ............. 357/34 |
| 0194572 | 11/1982 | Japan ................................ 437/31 |
| 0089457 | 5/1984 | Japan ................................ 437/31 |
| 0135764 | 8/1984 | Japan ................................ 437/31 |
| 1290194 | 12/1969 | United Kingdom . |
| 1506066 | 4/1976 | United Kingdom . |
| 1573496 | 4/1978 | United Kingdom . |
| 2129214 | 5/1984 | United Kingdom ................. 357/34 |
| 2157079 | 3/1985 | United Kingdom . |

OTHER PUBLICATIONS

D. D. Tang, "Subnanosecond Self-Aligned I$^2$L/MTL Circuits", IEEE Transactions on Electron Device, vol. ED-27, No. 8, Aug. 1980.

C. Y. Ting, "Silicide for Contacts and Interconnects", IEDM 84, pp. 110–113.

Primary Examiner—Brian E. Hearn
Assistant Examiner—Tom Thomas
Attorney, Agent, or Firm—Lowe, Price, LeBlanc, Becker & Shur

[57] ABSTRACT

In a bipolar transistor according to the present invention, interposed between both of a polysilicon film (603) on an emitter layer (3) and a first metal silicide film (502) on the polysilicon film (603) and a second metal silicide film (501) on a base layer (52) is only an oxide insulation film (105) on the edge wall of the polysilicon film (603).

In a method of manufacturing a bipolar transistor according to the present invention, a source (603) of first conductive type impurity and a source (6) of second conductive type impurity provided parallel to each other simultaneously diffuse the said impurities, whereby emitter and base layers can be formed substantially parallel to each other while the emitter layer is in contact with an isolation region.

1 Claim, 7 Drawing Sheets

4,803,174

BIPOLAR TRANSISTOR INTEGRATED CIRCUIT AND METHOD OF MANUFACTURING THE SAME

This application is a continuation of application Ser. No. 801,789, filed Nov. 26, 1985, now abandoned.

BACKGROUND OF THE INVENTION

1. Field of the Invention

The present invention generally relates to a bipolar transistor integrated circuit, and more particularly, it relates to an improvement in an electrode portion of a bipolar transistor in an integrated circuit.

2. Description of the Prior Art

In general, a bipolar transistor for an integrated circuit is formed in an island electrically isolated by a method such as p-n junction isolation, oxide film isolation or triple diffusion. Such a semiconductor device is disclosed in, e.g., U.S. Pat. No. 4,445,268 and U.S. patent application Ser. No. 698,523 filed Feb. 5, 1985. Further, formation of a self-aligned semiconductor device is disclosed in "Subnanosecond Self-Aligned I²L/MTL Circuits", IEEE Transactions on Electron Device, Vol. ED-27, No. 8, August 1980, p. 1379.

FIGS. 1A to 1E are cross-sectional views showing principal steps of a conventional method of manufacturing a bipolar transistor in an integrated circuit. The conventional method is now described with reference to these drawings. An $n^+$-type layer 2 of high impurity concentration for implementing a buried collector layer is selectively formed on a $p^-$-type silicon substrate 1 of low impurity concentration, followed by growth of an $n^-$-type epitaxial layer 3 thereon (FIG. 1A).

Then the substance is selectively oxidized by utilizing a nitride mask film 201 on an under-layer oxide film 101, whereby a thick isolation oxide film 102 is formed while a p-type channel-cut layer 4 is simultaneously formed under the isolation oxide film 102 (FIG. 1B).

The nitride film 201 and the under-layer oxide film 101 are then removed to newly form an oxide film 103 for preventing ion channelling in the silicon crystal during ion implantation, thereby to form a $p^+$-type layer 5 for implementing an extrinsic base layer with a photoresist mask film (this mask film is not shown). Thereafter the photoresist film is removed to newly form a photoresist mask film 301 for forming a p-type layer 6 for implementing an active base layer by ion implantation (FIG. 1C).

The photoresist film 301 is then removed and the substance is covered by a passivation film 401 generally made of phospho-silicate glass (PSG). The substance is then subjected to heat treatment for annealing the ion implanted layers 5 and 6 to form an extrinsic base layer 51 and an active base layer 61 at an intermediate stage as well as densificating the PSG film 401, followed by formation of holes 70 and 80 in the PSG film 401 to form an $n^+$-type layer 7 for implementing an emitter layer and an $n^+$-type layer 8 for implementing a low resistance layer underneath a collector electrode by ion implantation (FIG. 1D).

Thereafter the respective ion implanted layers are annealed to completely implement an extrinsic base layer 52 and an active base layer 62 and to form an emitter layer 71 and a low resistance layer 81, followed by formation of hole 50 for a base electrode. Then the respective holes 50, 70 and 80 are provided with films 501 of metal silicide such as platinum silicide (Pt-Si) and palladium silicide (Pd-Si) for preventing junction-spike of the electrodes, followed by formation of a base electrode wire 9, an emitter electrode wire 10 and a collector electrode wire 11 by low-resistance metal such as aluminum (Al) (FIG. 1E).

FIG. 2 is a plan view showing a pattern of single-base structure which corresponds to FIG. 1E.

Generally, the frequency characteristic of a transistor depends on the base-collector capacitance and the base resistance, both of which must be decreased for improving the frequency characteristic. The $p^+$-type extrinsic base layer 52 is provided for lowering the base resistance in the aforementioned structure, whereas the provision of the same leads to an increase in the base-collector capacitance. In FIG. 2, an inactive base area between an emitter area 71 and an isolation oxide film boundary A also increases the base-collector capacitance. Thus, the emitter area 71 may be bounded by the isolation oxide film to be in walled a emitter structure. However, such a method involves various disadvantages as will be seen from FIGS. 3A to 3C.

FIGS. 3A to 3C are partial enlarged sectional views taken along the line X—X in FIG. 2. In FIG. 3A, boron is injected with a photoresist mask film 301 to form a base layer. Then, etching of the walled emitter structure is enhanced at the boundary of an isolation oxide film 102 as indicated by symbol A in FIG. 3B, and thus the emitter layer 71 is locally deepened as shown at B in FIG. 3C. Thus, lowered is controllability of the current amplification factor and increased is possibility of emitter-collector short circuit at the point B in FIG. 3C. Further, as shown in FIG. 2, the base resistance depends on a separation $D_1$ between the emitter area 71 and the base electrode 501 (hole 50), i.e., the separation between the base wire 9 and the emitter wire 10 plus the total width of mrrgins of the respective wires 9 and 10 extending beyond the respective width of holes 50 and 70, and such margins inevitably remain even if the distance between the electrode wires 9 and 10 is reduced by improving accuracy of photoetching.

The transistor may also be brought in the double-base structure as shown in FIG. 4 for reducing the base resistance, as well known in the art. However, the increased base area of the double-base structure results in increasing of the base-collector capacitance.

SUMMARY OF THE INVENTION

Accordingly, a principal object of the present invention is to provide a bipolar transistor integrated circuit, the frequency characteristic of which is improved by reduction in both base resistance and base-collector capacitance.

A bipolar transistor according to the present invention comprises a first conductivity type collector layer surrounded by an isolation oxide film, a second conductivity type base layer formed on a part of the collector layer, a first conductivity type emitter layer formed on a part of the base layer, a first conductivity type polysilicon film formed on the emitter layer and extending to a wiring hole on the isolation oxide film, a first metal silicide film formed on the polysilicon film, a second metal silicide film formed on the base layer, and an oxide insulation film formed between both of the polysilicon film and the first metal silicide film and the second metal silicide film.

In such a transistor, the spacing between the emitter area and the base electrode can be effectively decreased since only the insulation film is interposed between the both of the first metal silicide film and the polysilicon film on the emitter layer and the second metal silicide film on the base layer. Consequently, the base area can be decreased and thus the base resistance and base-collector capacitance both can be reduced, thereby to improve the frequency characteristic of the transistor.

A method of manufacturing a bipolar transistor in an integrated circuit according to the present invention comprises the steps of forming a first conductivity type collector layer surrounded by an isolation oxide film, forming a polysilicon film on the collector layer, selectively forming a nitride mask film on the polysilicon film, selectively oxidizing the polysilicon film with the nitride mask film to form a first oxide film while partially leaving the polysilicon film in areas for defining emitter and collector electrodes, introducing first conductivity type impurity into the left polysilicon film, partially removing the first oxide film on an area to form a base layer with a photoresist mask, injecting second conductivity type impurity by ion implantation into region where the first oxide film has been removed and the region underneath the polysilicon film of the emitter electrode, and further diffusing the injected second conductivity type impurity to form a base layer while simultaneously diffusing the first conductivity type impurity from the polysilicon film of the emitter electrode thereby to form an emitter layer.

According to this method, the emitter and base layers can be formed substantially parallel to each other while the emitter layer is bounded by an isolation region, since the base layer is formed by diffusion of the second conductivity type impurity and the emitter layer is simultaneously formed by diffusion of the first conductivity type impurity. Thus, the region of the inactive base layer is reduced to decrease both the base resistance and base-collector capacitance, thereby to enable manufacturing of a transistor having an excellent frequency characteristic.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1A:
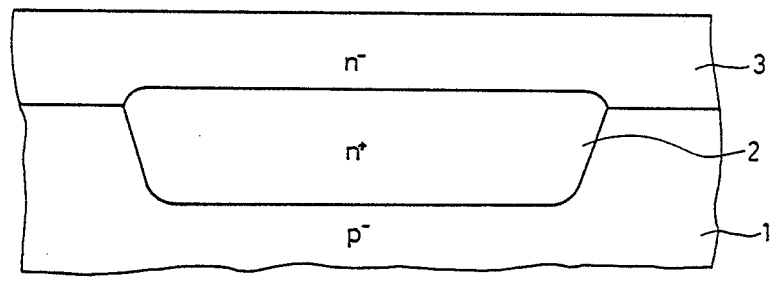
FIGS. 1A to 1E are sectional views showing principal steps of a conventional method of manufacturing a bipolar transistor for an integrated circuit.

FIGS. 5A to 5F are sectional views showing principal steps of a method of manufacturing a bipolar transistor according to an embodiment of the present invention, and elements equivalent to those in FIGS. 1A to 1E are indicated by the same reference numerals.

Figure 1B:
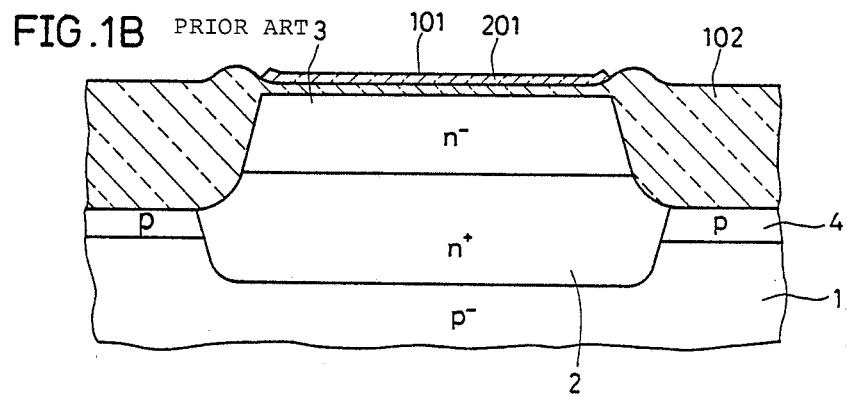
Figure 1C:
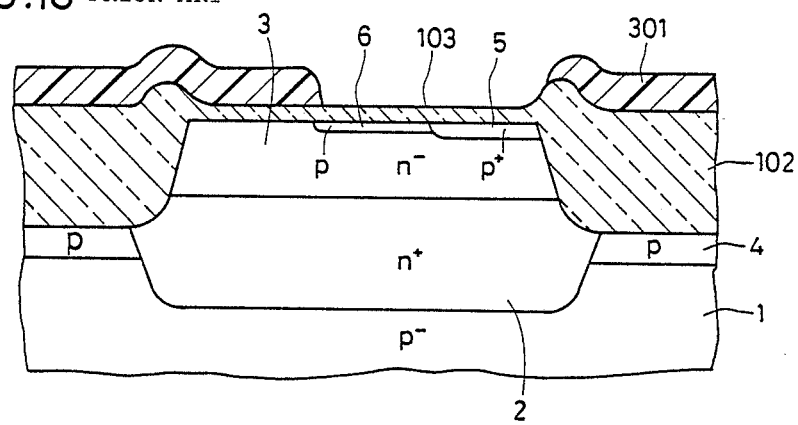
Figure 1D:
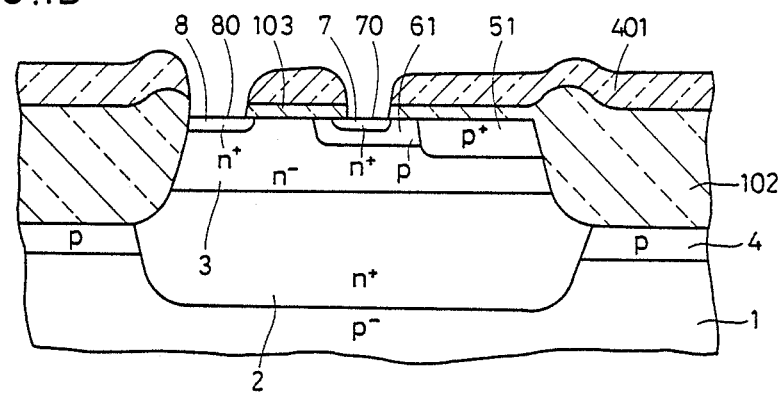
Figure 1E:
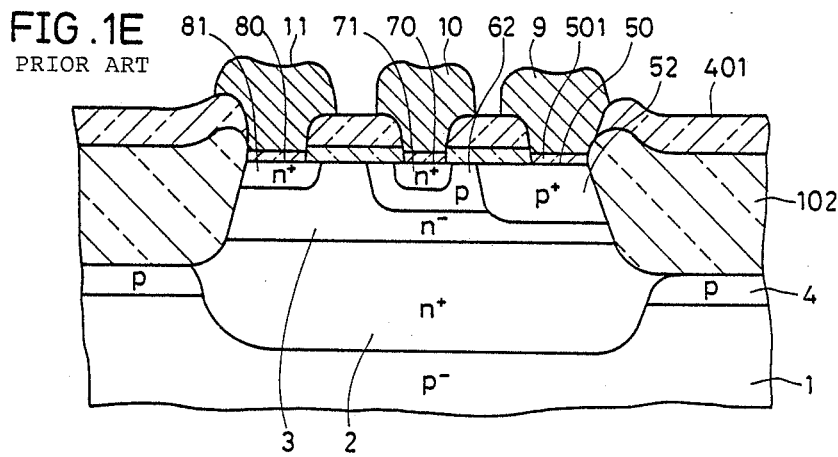
Figure 2:
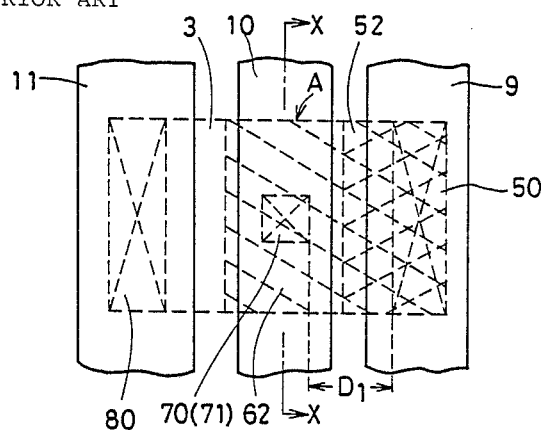
FIG. 2 is a plan view showing a surface pattern of a single-base structure of the transistor shown in FIG. 1E.
Figure 5A:
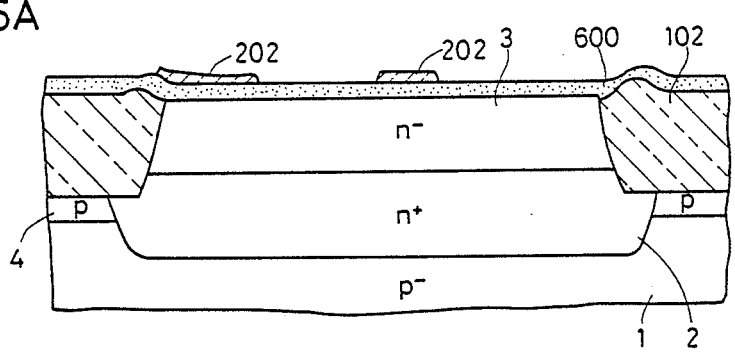
FIGS. 5A to 5F are sectional views showing principal steps of a method of manufacturing a bipolar transistor according to an embodiment of the present invention.

Similarly to the steps of the conventional method as shown in FIGS. 1A and 1B, formed on a $p^-$-type silicon substrate 1 are an $n^+$-type buried collector layer 2, an $n^-$-type epitaxial layer 3, a p-type channel-cut layer 4 and an isolation oxide film 102, and then removed are a nitride mask film 201 and an under-layer oxide film 101. Thereafter a polysilicon film 600 is formed to be coated with a nitride film 202, and the substance is so patterned as to partially leave the nitride film 202 in portions to define collector and emitter electrodes (FIG. 5A). In this case, an under-layer oxide film (not shown) may be formed by oxidizing the surface of the polysilicon film 600 under the nitride film 202. Or, the surface of the polysilicon film 600 may be slightly etched in patterning of the nitride film 202 without forming the under-layer oxide film.

Figure 5B:
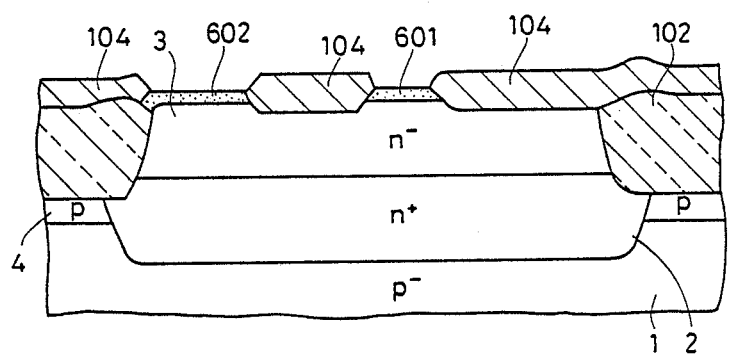

Then the polysilicon film 600 is selectively oxidized with the nitride mask film 202 to form an oxide mask film 104, with which n-type impurity is introduced into the polysilicon film 600 to form $n^+$ polysilicon films 601 and 602 (FIG. 5B). In this step, selective oxidation is so performed that not only the polysilicon film 600 but an $n^-$-type semiconductor substrate 3 may be slightly oxidized.

Figure 5C:
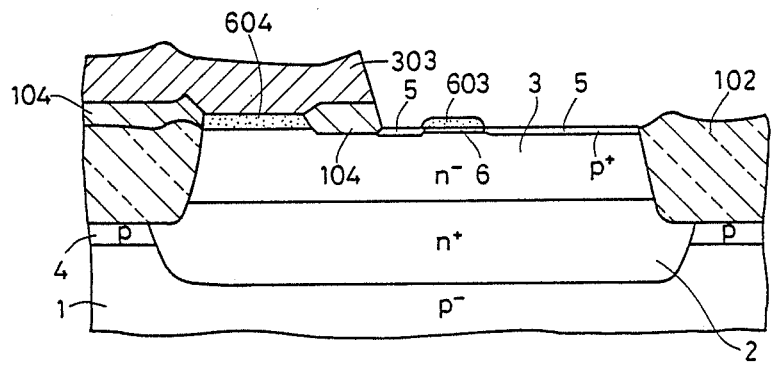

Then the oxide film 104 is removed in an area 5 to define base layer with a photoresist mask film 303 while injecting p-type impurities by ion implantation with the photoresist mask film 303 (FIG. 5C). The region 6 for defining an active base layer is smaller in depth than the region 5 for defining an extrinsic base layer since p-type impurity is injected by ion implantation through a polysilicon film 603 for forming an emitter electrode.

Figure 5D:
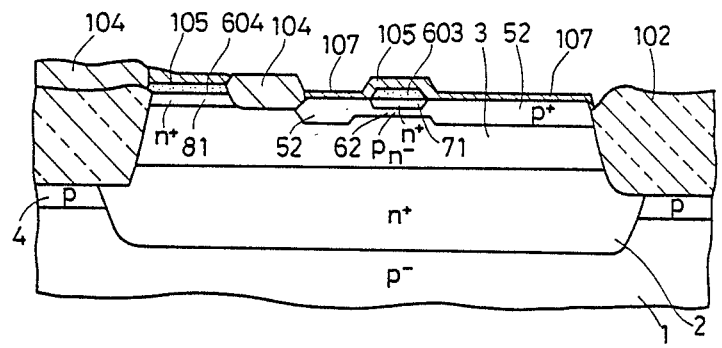

Then simultaneously performed are annealing of the layer into which the p-type impurity is injected by ion implantation and diffusion of n-type impurity from polysilicon films 603 and 604. An extrinsic base layer 52 is formed to be slightly larger in depth and lower in resistance than an active base layer 62, while an emitter layer 71 and a collector low resistance electrode layer 81 are formed simultaneously. The substance is then oxidized at a low temperature of about 800° C. to 900° C. to form thicker oxide films 105 on the polysilicon films 603 and 604 and a thinner oxide film 107 on the $p^+$-type layer 52 (FIG. 5D). It is well known in the art that oxidation is enhanced at a lower temperature in silicon and polysilicon containing highly concentrated n-type impurity such as phosphor or arsenic.

Figure 5E:
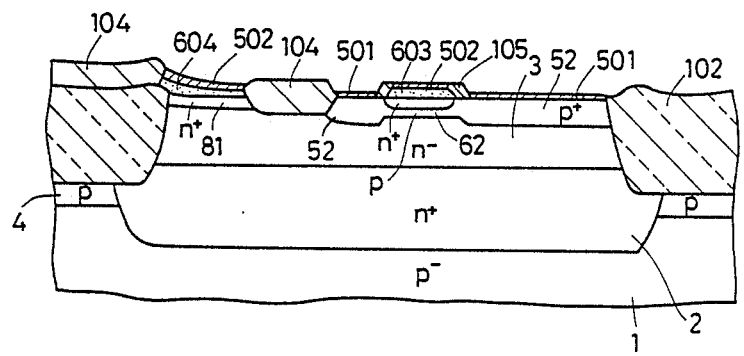

Then the thinner oxide film 107 and the thicker oxide films 105 on the polysilicon films 603 and 604 all are anisotropically etched to partially leave the oxide film on the edge wall of the polysilicon film 603. Thereafter a metal layer (not shown) of, e.g., platinum (Pt), palladium (Pd), titanium (Ti), tungsten (W) or molybdenum (Mo) is formed on the entire surface by evaporation or sputtering, in order that metal silicide films 501 and 502 may be formed by sintering on the exposed surface of the silicon substrate 1 and the surfaces of the polysilicon films 603 and 604. After formation of those silicide films, the residual metal layer is removed by etching with, e.g., aqua regia (FIG. 5E).

Figure 5F:
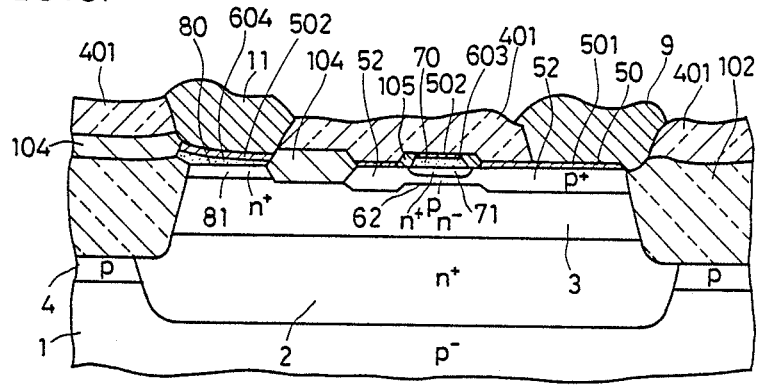

Then the substance is covered by a passivation film 401, which in turn is selectively etched to form a base wiring hole 50, an emitter wiring hole 70 (not shown) and a collector wiring hole 80. Thereafter a base electrode wire 9, an emitter electrode wire 10 (not shown) and a collector electrode wire 11 are respectively formed by a low-resistance metal such as aluminum (Al) (FIG. 5F). As seen from FIG. 5F, the low-resistance metal silicide film 501 in contact with the base wire 9 extends to a portion close to the emitter layer 71, thereby to remarkably reduce the base resistance. The spacing between the emitter area and the base electrode substantially corresponds to thickness of the oxide film 105 left on the edge wall of the polysilicon film 603. In order to further reliably prevent short circuit between the base electrode (the metal silicide film 501 in this case) and the emitter layer 71, a nitride film may be formed on the surface of the substance shown in FIG. 5D to be anisotropically etched to leave an oxide-nitride film on the edge wall of the polysilicon film 603.

Figure 3A:
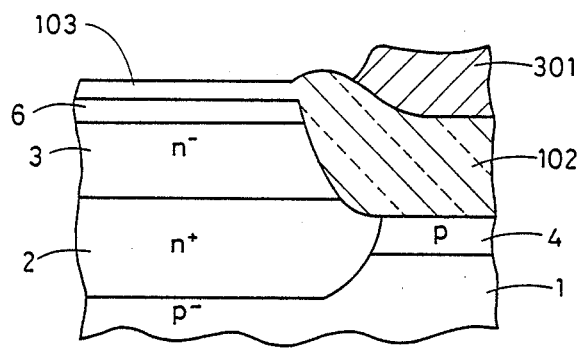
FIGS. 3A to 3C are partial enlarged sectional views for illustrating a transistor manufactured by a conventional method such that an emitter layer is in contact with an isolation oxide film.
Figure 3B:
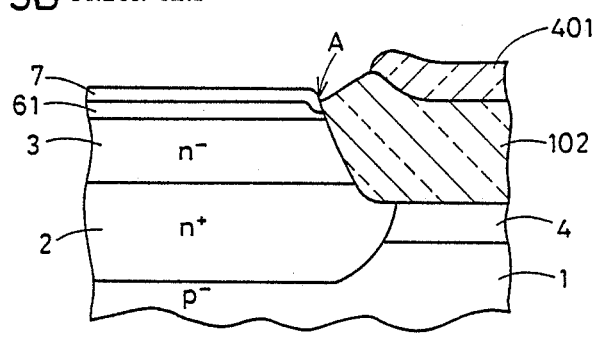
Figure 3C:
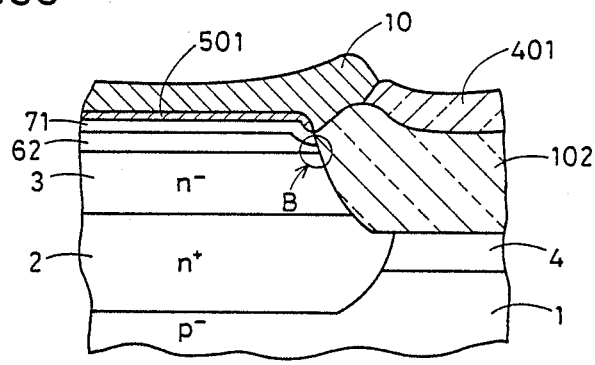
Figure 4:
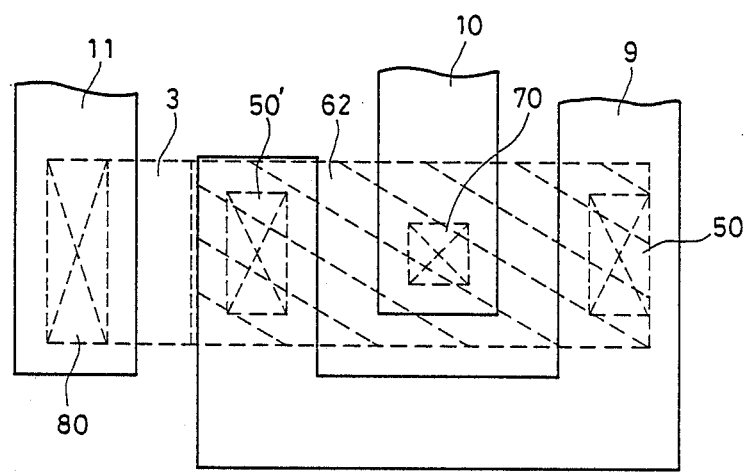
FIG. 4 is a plan view showing a pattern of a double-base structure of a conventional transistor.
Figure 6:
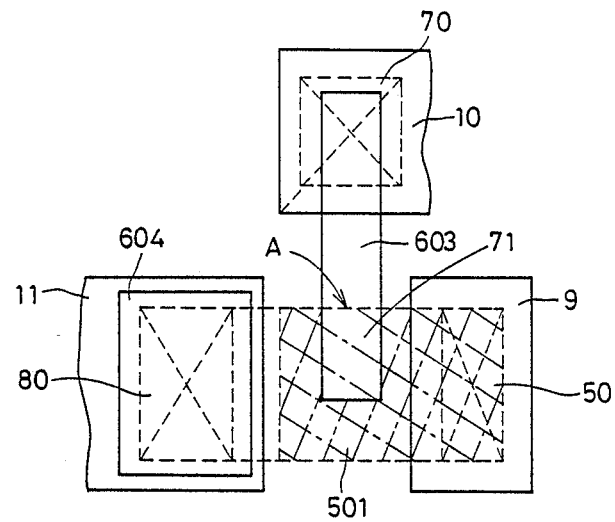
FIG. 6 is a plan view showing a pattern of a double-base structure of the transistor shown in FIG. 5F.
Figure 7:
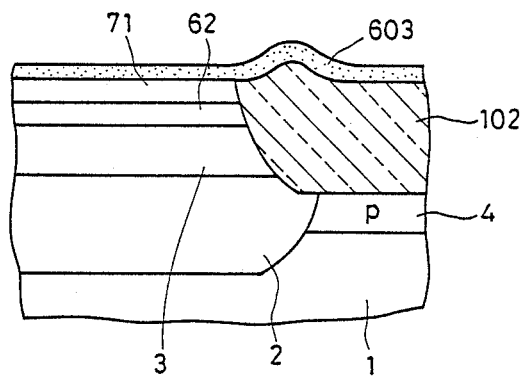
FIG. 7 is a partial enlarged sectional view showing a state in which an emitter layer of the transistor shown in FIG. 5F is in contact with an isolation oxide film.

FIG. 6 is a plan view showing a surface pattern of the transistor shown in FIG. 5F. As seen from FIG. 6, the polysilicon film 603 serves as a diffusion source for the emitter layer 71 which is thus in contact with an isolation oxide film 102 at a portion A. Further, the base thickness is not narrowed at the boundary A of the isolation oxide film 102 as shown in FIG. 3 but constant since the emitter layer 71 and the active base layer 62 are simultaneously formed to be substantially parallel to each other as shown in FIG. 7. Thus, the base area is remarkably reduced with no wide separation area between the emitter and base electrodes, thereby to reduce the base-collector capacitance. Further, as shown in FIG. 6, the metal silicide film 501 in contact with the base wire 9 is formed around three sides of the emitter layer 71 to automatically implement double-base structure, thereby to remarkably reduce base resistance without increasing the base region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a bipolar transistor, which comprises the steps of:
   forming a first conductivity type collector layer (3) surrounded by a isolation oxide film (102);
   forming a polysilicon film (600) on said collector layer;
   selectively forming a nitride film (202) on said polysilicon film;
   selectively oxidizing said polysilicon firm with said nitride film thereon serving as a mask to form a first oxide film (104) while leaving a polysilicon films (601, 602) for defining emitter and collector electrodes, said polysilicon film (601) for said emitter electrode extending to an area on said isolation oxide film for defining a wiring hole;
   introducing first conductivity type impurity into said remaining polysilicon films (601, 602) with said first oxide film (104) serving as a mask;
   removing said first oxide film (104) from a region for defining a base layer;
   injecting second conductivity type impurity into the region (5, 6) for defining said base layer by ion implantation, said conductivity type impurity being injected into the region (6) for forming an active base layer (62) through the polysilicon film (603) for defining said emitter electrode;
   diffusing said injected second conductivity type impurity to form said base layer while simultaneously diffusing said first conductivity type impurity introduced into the polysilicon films (603, 604) from the same to form an emitter layer (71) and low resistance collector contact layer (81);
   oxidizing said polysilicon film (603) on said emitter layer and the surface of said base layer at a low temperature to form a second oxide film (107);
   removing said second oxide film (107) while leaving a portion (105) thereof on the edge wall of said polysilicon film (603) on said emitter layer;
   forming metal silicide films (502, 501) on at least said polysilicon film on said emitter layer and said base layer; and
   forming a protection film on the surface of the entire region and an emitter wire, a base wire and a collector wire through contact holes provided in said protection film.

* * * * *